United States Patent [19]
Mehrad

[11] Patent Number: 5,604,150
[45] Date of Patent: Feb. 18, 1997

[54] CHANNEL-STOP PROCESS FOR USE WITH THICK-FIELD ISOLATION REGIONS IN TRIPLE-WELL STRUCTURES

[75] Inventor: Freidoon Mehrad, Plano, Tex.

[73] Assignee: Texas Instruments Incorporated, Dallas, Tex.

[21] Appl. No.: 547,852

[22] Filed: Oct. 25, 1995

[51] Int. Cl.$^6$ ............................................. H01L 21/76
[52] U.S. Cl. .................... 437/70; 437/52; 437/48; 437/27; 437/28
[58] Field of Search ..................... 437/52, 43, 26, 437/27, 28, 29, 48, 70

[56] References Cited

U.S. PATENT DOCUMENTS

| | | |
|---|---|---|
| 5,240,874 | 8/1993 | Roberts ............................ 437/28 |
| 5,296,393 | 3/1994 | Smayline et al. .................. 437/52 |
| 5,397,727 | 3/1995 | Lee .................................... 437/70 |
| 5,397,734 | 3/1995 | Iguchi et al. ...................... 437/70 |
| 5,453,393 | 9/1995 | Bergemont ........................ 437/52 |

Primary Examiner—Trung Dang
Attorney, Agent, or Firm—Theodore D. Lindgren; Leo N. Heiting; Richard L. Donaldson

[57] ABSTRACT

To ensure proper electrical insulation under thick-field isolation regions (23) grown in triple-well structures, the channel-stop impurity (30) is implanted using multiple doses at different energies, depending on the oxide thickness of the thick-field isolation regions (23). The split-implant procedure results in much wider process variation windows for the thick-field isolation regions (23). Process variations include oxide thickness of grown oxide, implant energy/dose and reduced thickness caused by wet de-glazing steps.

20 Claims, 5 Drawing Sheets

CHANNEL-STOP PROCESS FOR USE WITH THICK-FIELD ISOLATION REGIONS IN TRIPLE-WELL STRUCTURES

BACKGROUND OF THE INVENTION

This invention relates to channel-stop implants under thick-field isolation regions formed on triple-well structures to provide electrical insulation between N-channel field-effect devices.

Certain Flash Electrically-erasable, Programmable Read-Only-Memory (Flash EPROM) arrays are formed using triple-well structures. A compensation method is used to form a typical triple-well structure in a silicon substrate of P-type conductivity. The first step is to implant phosphorous in the substrate, then perform a tank-drive step to form wells of N-type conductivity (N-wells). The next step is to implant boron, followed by a second tank-drive step, to create isolated wells of P-type conductivity (P-wells) inside the N-wells. Therefore, the P-wells contain both boron and phosphorous, with boron predominating. The triple-well structure is completed by forming source/drain diffusions of N-type conductivity in the P-wells. The source/drain diffusions are a part of N-channel devices such as memory cells or peripheral transistors. Memory cells and many of the transistors of peripheral circuits require electrical separation between these source/drain diffusions.

In general, EPROMs of all types use boron channel-stop implants under grown thick-field isolation regions to provide electrical isolation between N-channel memory cells and between N-channel peripheral transistors. However, use of boron channel-stop implants under thick-field isolation regions formed on triple-well structures causes a unique problem. The segregation coefficient M, which is defined as the ratio of impurity concentration in silicon over impurity concentration in silicon dioxide, is less than one for boron and is greater than one for phosphorous. This results in boron depletion in the silicon immediately under a thick-field isolation region grown in a P-well structure and results in a phosphorous accumulation in the silicon immediately under a thick-field isolation region grown in a N-well structure. That is, during growth of the oxide forming the thick-field isolation regions, boron is depleted and simultaneously phosphorous is accumulated immediately under the thick-field isolation region. As a result, the phosphorous concentration overcomes the boron concentration in that location, creating a N-type region that is responsible for current leakage, possibly a short-circuit, under the thick-field isolation regions.

Using boron as a channel-stop implant before growing the thick-field isolation regions is one conventional method for preventing current leakage under those isolation regions in a P-well structure. In that conventional method, boron is implanted into the selected P-well sites before growing the oxide forming the thick-field isolation regions. The boron implant is made for the purpose of increasing the threshold voltage for current flow under the N+ thick-field isolation region. When a boron channel stop is implanted prior to growing the oxide forming the thick-field isolation regions in a triple-well structure, some boron diffuses deeper into silicon and some diffuses into the thick-field isolation region during the oxide growth. Therefore, a much higher dosage of boron is needed to overcome the phosphorous accumulation and to maintain as P-type the silicon region underlying the thick-field isolation region. However, a high-boron dose channel-stop implant has an adverse effect on the transistor-junction breakdown voltages under the thick-field isolation regions.

On the other hand, a second prior-art method uses a single high-energy channel-stop implant performed through the thick-field isolation regions, the implant performed after the oxide growth forming those regions. The high-energy implant is also intended to stop formation of a conductive channel in the silicon immediately under the thick-field isolation regions. However, when using this second prior-art method, there is a problem in placing a sufficient concentration of boron at the correct depth under the thick-field isolation regions. In a part of the detailed discussion below, high-energy channel-stop implants are simulated for thick-field isolation regions built in an isolated P-well formed inside a N-well. Simulation results indicate that if only one high-energy implant is performed, a precise channel-stop implant energy is needed to place the correct amount of boron under the thick-field isolation regions to stop channel conduction and source-to-drain shorts.

There is a great and continuing need to shrink the size of integrated-circuit devices in both the horizontal and the vertical directions. That need includes shrinking the size of thick-field isolation regions to allow placement of more transistor devices on a silicon substrate. There is also a great and continuing need for thick-field isolation regions that are not only small and thin, but that are easy to manufacture and easy to shrink in size as minimum photolithographic capabilities become available. Preferably, the channel-stop implant method used to accomplish these goals should, at the same time, be independent of process variations. Those variations include:

1) minor changes in energy and dosage of the channel-stop implants, and 2) variation in the thickness of the thick-field isolation regions, including non-uniform thickness resulting from wet de-glazing steps.

SUMMARY OF THE INVENTION

Accordingly, this invention describes multiple high-energy channel-stop implants made through the oxide of thick-field isolation regions, the implants providing, for example, proper electrical isolation for flash EEPROM memory cells and N-channel peripheral transistors that are built in isolated P-wells inside N-wells. This invention overcomes the necessity for use of precise channel-stop implant energy to place the right dosage at the right position under thick-field isolation regions used in a triple-well structure. In addition, this invention allows greater process variation during manufacture. That is, the devices made using this invention are easier to manufacture than prior-art devices made using one high-energy implant.

To prevent current leakage, including short-circuits, under thick-field isolation regions used in triple-well structures, at least two high-energy channel-stop implants are performed, each using a smaller implant dosage than the dosage used to manufacture prior-art, single-implant structures. The multiple high-energy implants are performed after growth of the thick-field isolation region, each of the multiple implants performed using a different energy. In the alternative, the multiple implants are performed later in the process, after one or more de-glazing steps. If two implants are used, each implant places half, for example, of the total channel-stop implant dosage under the thick-field isolation regions. Each implant places the implant impurities at a different depth. The multi-depth implants improve the breakdown voltages of the P-N junctions associated with the thick-field isolation regions. Both simulated results and data measured on actual silicon indicate a much wider processing variation window for multiple-implant boron dosages under the thick-field isolation regions. In addition, the results indicate less sensitivity to process variations across the wafer and across lots.

DETAILED DESCRIPTION OF THE INVENTION

Figure 1:
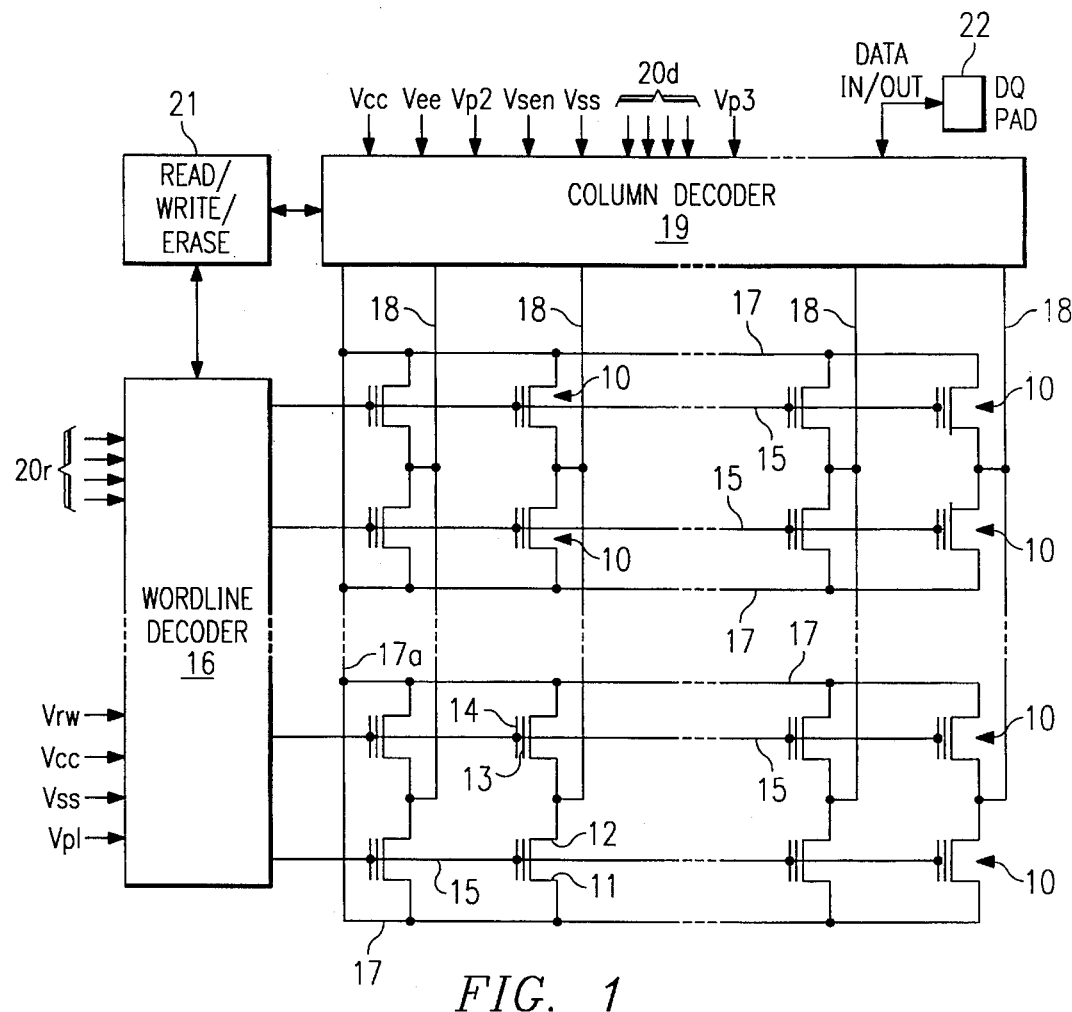
FIG. 1 is an electrical schematic diagram, in partial block form, of a memory cell array.

Referring to FIG. 1, an example array of memory cells, which is an integral part of a memory chip, is shown to illustrate use of the method of this invention. Each cell is a floating-gate transistor 10 having a source 11, a drain 12, a floating gate 13, a control gate 14. Each of the control gates 14 in a row of cells 10 is connected to a wordline 15, and each of the wordlines 15 is connected to a wordline decoder 16. Each of the sources 11 in a row of cells 10 is connected to a source line 17. Each of the drains 12 in a column of cells 10 is connected to a drain-column line 18. Each of the source lines 17 is connected by a common-column line 17a to a column decoder 19 and each of the drain-column lines 18 is connected to the column decoder 19.

In the read mode, the wordline decoder 16 functions, in response to wordline address signals on lines 20r and to signals from Read/Write/Erase control circuit 21 (or microprocessor 21), to apply a preselected positive voltage $V_{CC}$ (approx. +5 V) to the selected wordline 15, and to apply a low voltage (ground or $V_{SUB}$) to deselected wordlines 15. The column decoder 19 functions to apply a preselected positive voltage $V_{SEN}$ (approx. +1 V) to at least the selected drain-column line 18 and to apply a low voltage (0 V) to the source line 17. The column decoder 19 also functions, in response to signal on address lines 20d, to connect the selected drain-column line 18 of the selected cell 10 to the DATA IN/OUT terminal. The conductive or nonconductive state of the cell 10 connected to the selected drain-column line 18 and the selected wordline 15 is detected by a sense amplifier (not shown) connected to the DATA IN/OUT terminal 22.

During a flash-erase mode, the column decoder 19 may function to leave all drain-column lines 18 floating (connected to a high impedance such as field-effect transistor biased in "OFF" condition). The wordline decoder 16 functions to connect all the wordlines 15 to reference potential $V_{SUB}$, which may be ground. The column decoder 19 also functions to apply a high positive voltage $V_{EE}$ (approx. +10 V to +15 V) to all the source lines 17. These erasing voltages create sufficient field strength across the gate oxide region to generate a Fowler-Nordheim tunnel current that transfers charge from the floating gate 13, erasing the memory cell 10. Since the potential on the wordline 15 is 0 V, the cell 10 remains in the nonconducting state during erase. For that reason, and because the drain 12 is floated, no channel-hot carriers are generated.

In a write or program mode, the wordline decoder 16 may function, in response to wordline address signals on lines 20r and to signals from Read/Write/Erase control circuit 21, (or microprocessor 21) to place a preselected first programming voltage $V_{P1}$ (approx. +12 V) on a selected wordline 15, including a selected control-gate 14. Column decoder 19 also functions to place a second programming voltage $V_{P2}$ (approx. +5 to +10 V) on a selected drain-column line 18 and, therefore, the drain 12 of selected cell 10. The source lines 17 are connected to reference potential $V_{SUB}$, which may be ground. All of the deselected drain-column lines 18 are connected to reference potential $V_{SUB}$ or are floated. These programming voltages create a high current (drain 12 to source 11) condition in the channel of the selected memory cell 10, resulting in the generation near the drain-channel junction of channel-hot electrons and avalanche-breakdown electrons that are injected across the channel oxide to the floating gate 13 of the selected cell 10. The programming time is selected to be sufficiently long to program the floating gate 13 with a negative program charge of approximately −2 V to −6 V with respect to the channel region (with $V_{P1}$ at 0 V). For memory cells 10 fabricated in accordance with the example embodiment, the coupling coefficient between a control gate 14/wordline 15 and a floating gate 13 is approximately 0.6. Therefore, a programming voltage $V_{P1}$ of 12 V, for example, on a selected wordline 15, including the selected control gate 14, places a voltage of approximately +7.2 V on the selected floating gate 13. The voltage difference between the floating gate 13 (at approx. +7.2 V) and the grounded (approx. 0 v) source line 17 is insufficient to cause a Fowler-Nordheim tunneling current across the gate oxide between source 11 and floating gate 13 to charge the floating gate 13 of a selected or deselected cell 10. The floating gate 13 of the selected cell 10 is charged with hot electrons injected during programming, and the electrons in turn render the source-drain path under the floating gate 13 of the selected cell 10 nonconductive with a positive read voltage on control gate 14, a state that is read as a "zero" bit. Deselected cells 10 have source-drain paths under the floating gate 13 that remain conductive, and those cells 10 are read as "one" bits.

Figure 2:
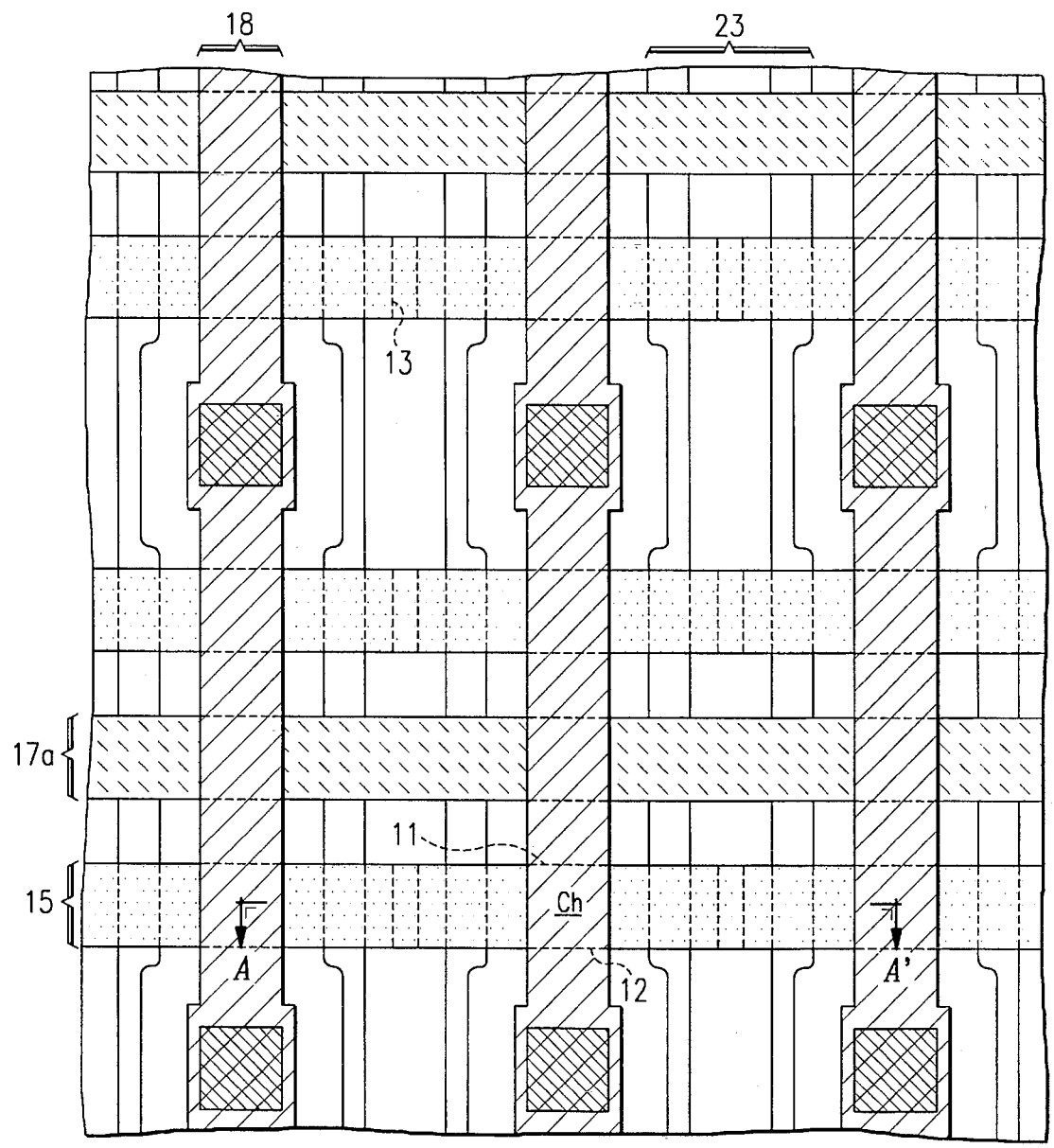
FIG. 2 is an enlarged plan view of a small pan of a memory cell array layout.

Referring to FIG. 2, an example of a memory-array layout including the thick-field isolation regions 23 is illustrated for the purpose of describing this invention. The thick-field isolation regions 23 are an integral part of a memory-array part of the chip as well as a part of the chip that includes N-channel peripheral devices in decoders 16 and 19, for example. In many circuits, the source/drain regions 11/12 of the N-channel memory cells and N-channel peripheral devices require electrical insulation from nearby source/drain regions 11/12.

Figure 3:
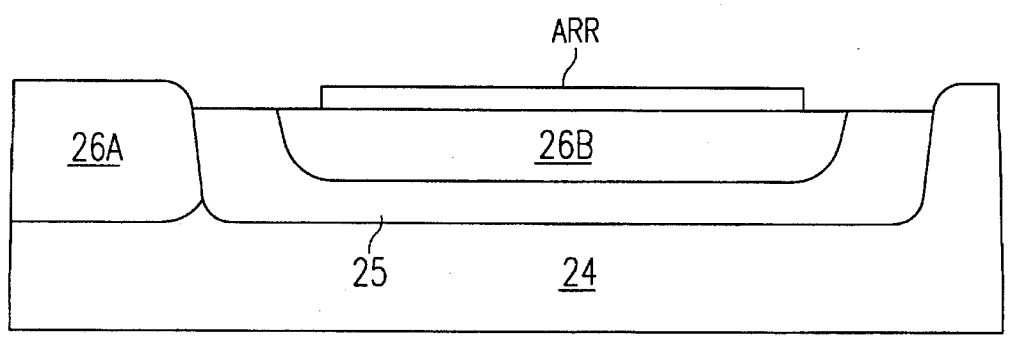
FIG. 3 is an enlarged cross-sectional view of a triple-well structure on which an array of the type shown in FIGS. 1 and 2 may be formed.
Figure 4:
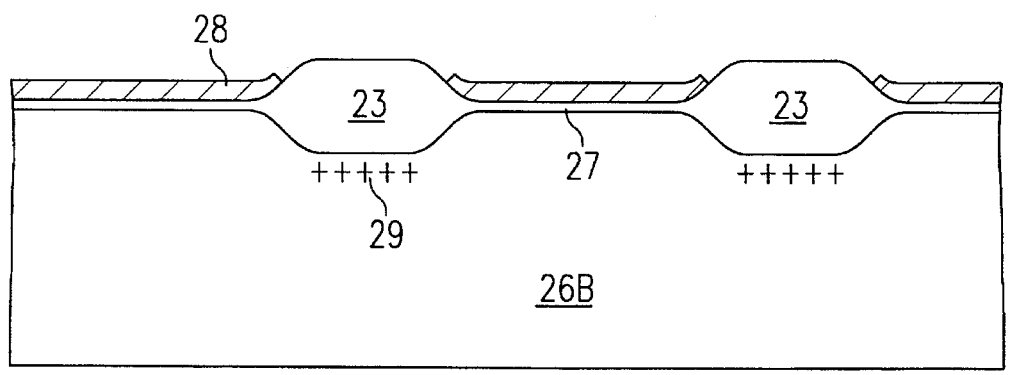
FIGS. 4 and 5 are enlarged cross-sectional views of a small pan of N-channel transistors (memory cell array or N-channel peripheral) including the isolation regions taken along line A—A' of FIG. 2 during early stages of construction.
Figure 5:
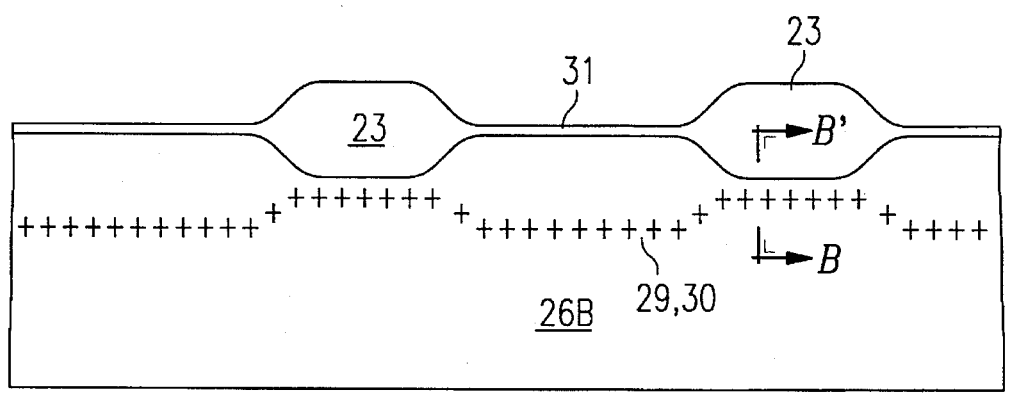

Referring to FIGS. 3, 4 and 5, a method for fabricating the device of FIGS. 1 and 2 is described. The substrate 24 a slice of P-type silicon perhaps eight inches in diameter. A number of other process steps would normally be performed, but here all that is discussed is the formation of N-channel transistors in isolated P-wells. For example, Flash EPROM memory devices and N-channel peripheral transistors may be built in isolated P-wells formed in N-wells.

Referring specifically now to FIG. 3, a pad-oxide layer (not shown) about 400 Angstroms thick is grown or deposited on the face of substrate 24. The pad-oxide layer protects the substrate 24 during the initial fabrication steps and will be subsequently removed. A silicon-nitride layer (not shown) is then deposited over the pad-oxide layer using low pressure chemical vapor deposition. The silicon-nitride layer is then patterned and plasma-etched to expose areas where the N-wells 25 will be implanted. A phosphorous implant at a dose of perhaps $2\times10^{13}/cm^2$ is performed to form the N-wells 25. Then the wafer (substrate 24) is placed in an oxidizing ambient to grow a thick tank oxide perhaps about 4000 Angstroms thick on top of the N-wells 25. After removing the nitride layer, a boron implant at a dose of perhaps $1.5\times10^{13}/cm^2$ is performed to create the P-wells 26A outside the N-wells 25. Next, all of the oxide is stripped and the silicon wafer 24 is placed in a furnace, where a tank drive is performed at 1100° C. for 1800 minutes. Then, after removing the oxide, a new pad-oxide layer (not shown) is grown or deposited. Next, the oxide is patterned (not shown) and exposed to open the isolated P-wells 26B inside the N-wells. A boron implant now is performed to create the isolated P-wells 26B at a dose of perhaps $2\times10^{13}/cm^2$. After removal of the photoresist and a clean-up step, a second high-temperature tank drive is done at 1100° C. for 500 minutes to drive the isolated P-wells 26B. Finally, the top oxide is removed and the memory array ARR is formed using conventional procedures, including formation of thick-field isolation regions 23 as well as deposit/mask/etch/implant/drive steps to form conductors and memory cells 10.

FIG. 4 shows a small part of isolated P-well 26B inside the N-well 25 of FIG. 3. The P-well 26B is where the N-channel devices are to be formed. These N-channel devices may be of a memory-cell 10 type or of a N-channel peripheral type. As illustrated in FIG. 4, a pad-oxide layer 27 about 400 Angstroms thick is grown or deposited. A silicon-nitride layer 28 is then deposited over the pad-oxide layer using low pressure chemical vapor deposition. The silicon-nitride 28 layer is then patterned and plasma-etched to expose areas where thick-field isolation regions 23, or thick-field insulators 23, are to be formed.

Optionally, a boron implant at a dose of about $3\times10^{12}/cm^2$ is then performed to create a regular P+ channel-stop region 29 that isolates memory cells and/or N-channel transistors in the standard P-well 26A (one not formed in a N-well 25). If this step is performed then, as a result, boron is again implanted into the isolated P-wells 26B. After removing the photoresist, the thick oxide that forms the thick-field isolation regions 23, as illustrated in FIG. 4, is thermally grown in a localized oxidation process to a thickness of about 6000–7000 Angstroms by exposure to steam at about 900° C. and one atmosphere for several hours. Alternatively, a high-pressure oxidation (HIPOX) procedure is used to decrease oxidation time. As is well known, the oxide 23 grows beneath the edges of the silicon-nitride layer, creating "bird's beak" areas instead of abrupt transitions. Finally, the remaining portions of the pad-oxide and silicon-nitride layers 27 and 28 are removed. The procedure exposes the silicon substrate 24 face at the isolated P-wells 26B between the thick-field isolation regions 23.

Referring next to FIG. 5, another pad oxide 31 is grown or deposited prior to the high-energy channel-stop implant. At this time the pad oxide 31 is patterned and exposed at the thick-field isolation regions 23 to open selectively the isolated P-wells 26B inside the N-wells 25 to a high-energy channel-stop implant. Then a high-energy channel-stop implant 30 is performed, for example, in two stages, placing half the total channel-stop implant 30 dosage under the thick-field isolation regions 23 at a first energy, then placing the other half of that dosage of channel-stop implant 30 at a second, different energy. FIG. 5 illustrates a blanket implant 30 for all of the P-well 26B. Therefore, the implant 30 is deeper in the silicon regions than the where the implant goes through the thick-field isolation regions 23. A blanket high-energy boron channel-stop implant 30 (in the range of about $1\times10^{12}$ to $6\times10^{12}/cm^2$) has a minimal effect on the threshold voltage of the N-channel devices (perhaps about 0.1 V shift). This is because the high-energy implant positions the impurities much deeper into silicon under the gate oxide as shown in FIG. 5 and, therefore, those impurities have a very small effect on the threshold voltage of the device. If desired, the pattern opens only the top of the thick-field isolation regions 23 in the isolated P-wells 26B, rather than opening the entire isolated P-well regions 26B. The channel-stop implant energies are a function of the thickness of the thick-field isolation regions 23. Therefore, the energies are chosen carefully for a particular process thickness. These high-energy channel-stop implants 30 need not be performed right after the thick-field isolation region 23 growth, but can be performed later in the process after the thick-field isolation regions 23 have become thinner during one or more de-glazing steps.

The rest of the processing steps, which are not related to this invention and are a part of a standard Flash EEPROM memory array ARR and CMOS peripheral transistors, are not discussed here. In general application of the process of this invention, the thick-field isolation regions 23 have gone through a few de-glazing steps and are perhaps 4000–5000 Angstroms thick. In addition, the total thermal cycle that channel-stop implant 30 has gone through is about 40 minutes at 1000° C.

Figure 6:
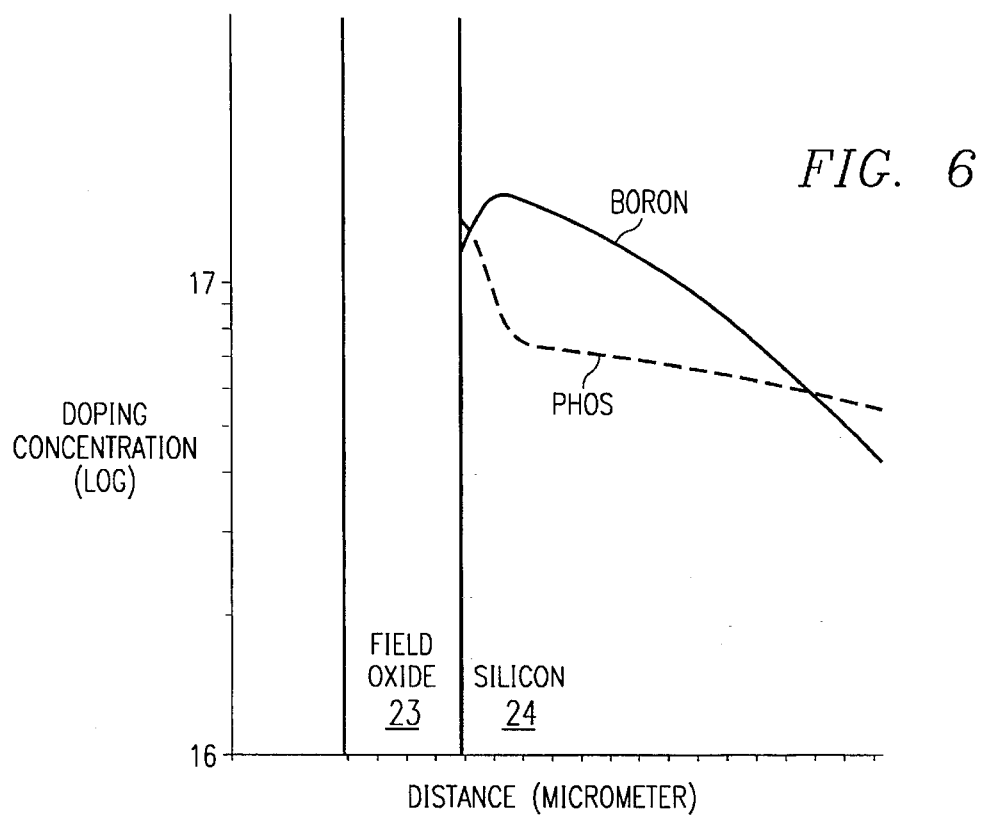
FIG. 6 is a one-dimensional plot of a simulated doping profile of a thick-field isolation region taken along line B—B' of FIG. 5 without high-energy channel-stop implant.

FIG. 6 depicts one-dimensional profiles of computer-simulated results for boron and phosphorous doping under the thick-field isolation region 23 of FIG. 5 along line B—B' for a case where no high-energy channel-stop 30 is implanted. As can be seen FIG. 6, after the thick-field isolation region 23 growth, the phosphorous is accumulated (dashed line) and boron is depleted (solid line).

Figure 7:
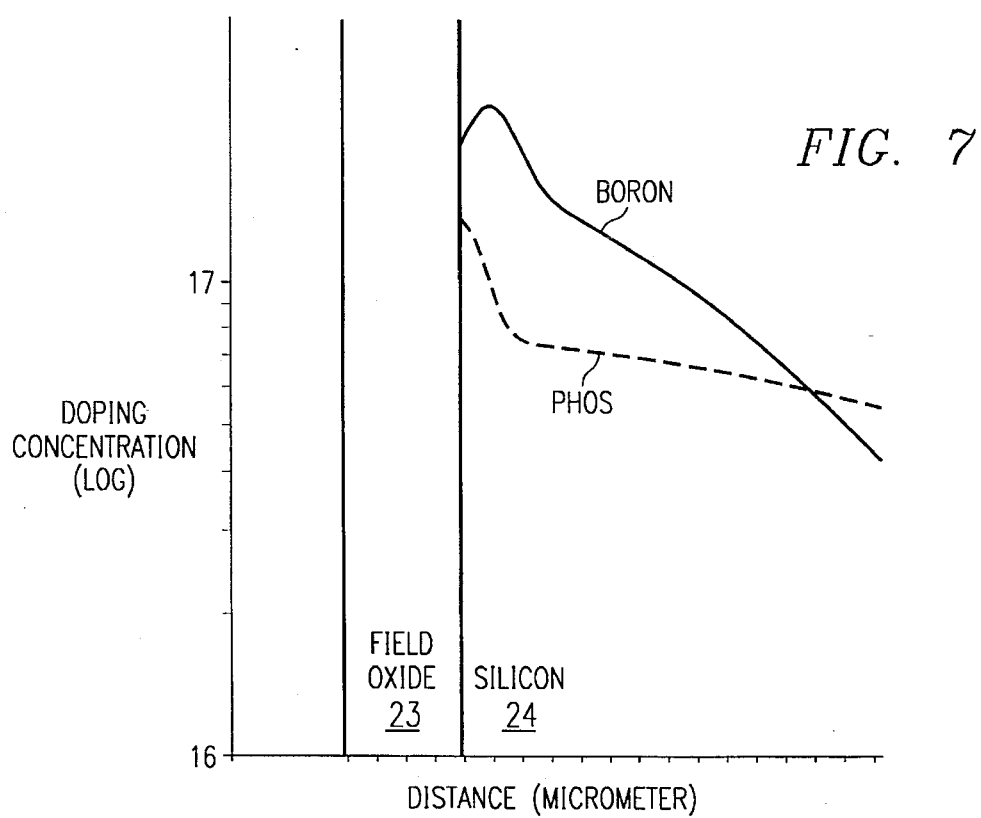
FIG. 7 is a one-dimensional plot of a simulated doping profile of a thick-field isolation region taken along line B—B' of FIG. 5 with a high-energy channel-stop implant of $3\times10^{12}/cm^2$ and energy of 150 KeV.

FIG. 7 depicts one-dimensional profiles of computer-simulated results for boron and phosphorous doping profiles under the thick-field isolation region 23 of FIG. 5 along line B—B' for a case where the channel-stop implant dose is $3\times10^{12}/cm^2$ with a single-implant energy of 150 KeV. As can be seen in FIG. 7, phosphorous is accumulated (dashed line) and the boron doping profile after the high-energy channel-stop implant (solid line) is higher than phosphorous concentration at the surface right under the thick-field isolation region 23.

Figure 8:
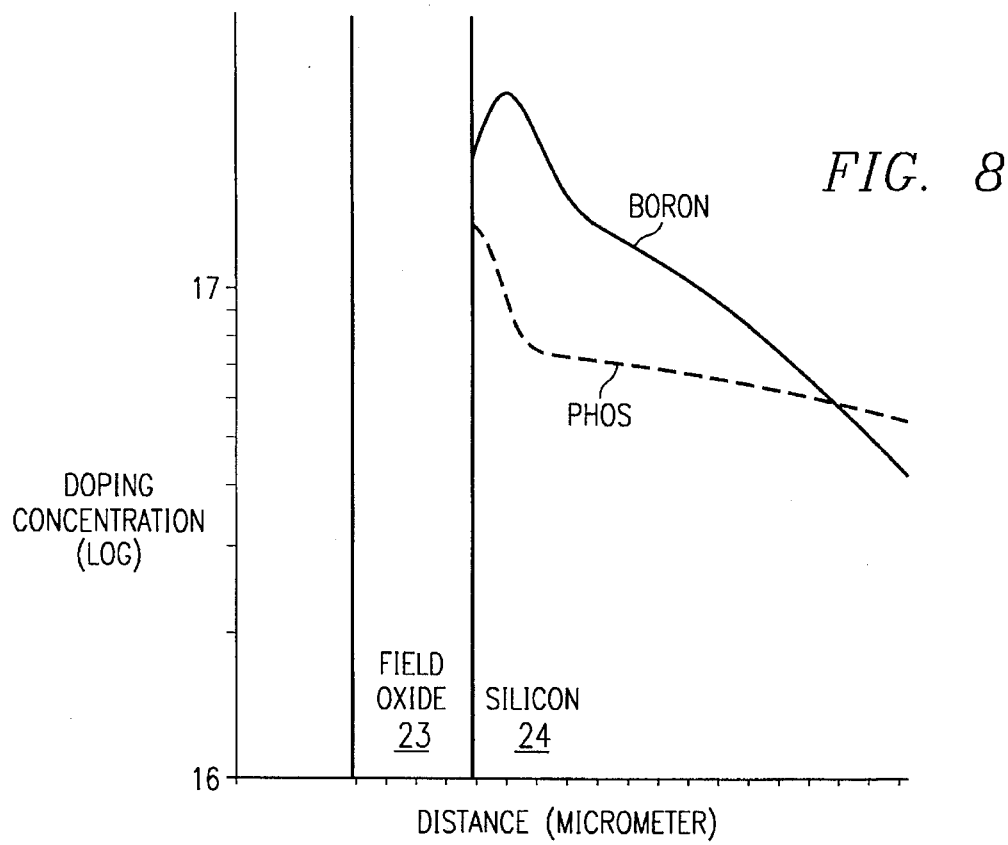
FIG. 8 is a one-dimensional plot of a simulated doping profile of a thick-field isolation region taken along line B—B' of FIG. 5 with a high-energy channel-stop implant of $3\times10^{12}/cm^2$ and energy of 170 KeV.

A similar case is shown in FIG. 8, where the single-implant energy is increased to 170 KeV. In FIG. 8, as compared to FIG. 7, the peak of boron concentration is deeper into silicon 24 and away from the edge of the thick-field isolation region 23 where, in effect, there is less boron concentration right under the thick-field isolation region 23. This result is the same if the oxide thickness of the thick-field isolation region 23 is varied while the channel-stop implant energy is fixed.

Figure 9:
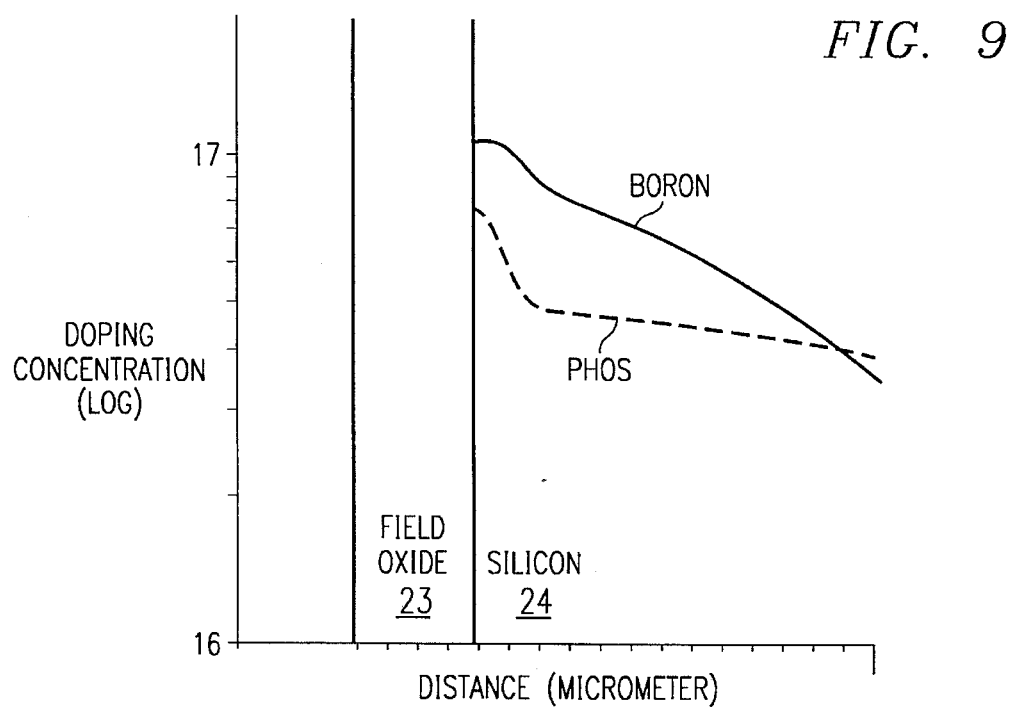
FIG. 9 is a one-dimensional plot of a simulated doping profile of a thick-field isolation region taken along line B—B' of FIG. 5 with two high-energy channel-stop implants, one of $2\times10^{12}/cm^2$ at an energy of 110 KeV, the other of $2\times10^{12}/cm^2$ at 120 KeV.

Finally, FIG. 9 illustrates the case where half the total channel-stop dose of $4\times10^{12}/cm^2$ is implanted at 110 KeV and the other half at 120 KeV. As can be seen, the boron concentration under the oxide thick-field isolation region 23 in FIG. 9 is flat, which indicates an increase in the process margin that is tolerated when using the procedure of this invention.

To evaluate the above simulated results, silicon was processed and characterized using four different-voltage channel-stop split implants with values close to those used for the computer-simulations. TABLE I indicates four cases, three having split high-energy channel-stop implants through a thick-field isolation region 23 of about 4000 Angstroms thickness fabricated on silicon 24.

TABLE I

| Case | High-Energy Channel-Stop Implant | |
|---|---|---|
| A | None | |
| B | $3.6 \times 10^{12}/cm^2$ | 120/135 Kev |
| C | $3.6 \times 10^{12}/cm^2$ | 130/145 Kev |
| D | $3.6 \times 10^{12}/cm^2$ | 140/155 Kev |

Figure 10:
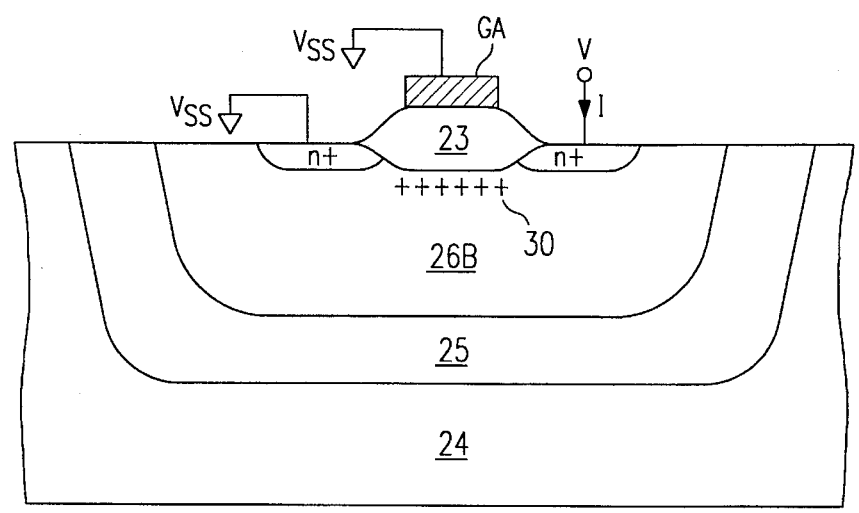
FIG. 10 illustrates a test structure for illustrating characteristics of the present invention.

TABLE II represents the electrical data taken from two types of structures implanted as described in TABLE I. The test structures are illustrated in FIG. 10, which illustrates a grounded gate GA over the thick-field isolation region 23 separating two N-type regions in a triple-well structure. One type of structure, Structure One, has a polysilicon gate GA while the other type of structure, Structure Two has a metal gate. As the voltage V is ramped the current I is measured. The electrical data in TABLE II is the voltage V at which the current I per unit width in the path under the thick-field isolation regions 23 reaches 1 $\mu A/\mu m$. As can be seen from the very small voltage for Case A, without high-energy channel-stop implant, does not provide any isolation. Case C is the best among the split-implant Cases B, C and D. In fact, the high-energy channel-stop implant of case C is optimized. The split-implant energies for Case B and for Case D are chosen slightly below and above the optimized case C, and show weaker isolation.

TABLE II

| Case | A | B | C | D |
|---|---|---|---|---|
| Structure One | 0.12 V | 11.9 V | 13.1 V | 10.6 V |
| Structure Two | 0.03 V | 11.1 V | 14.5 V | 11.8 V |

The simulated results and the data obtained from silicon structures illustrate the advantages of this method for performing high-energy channel-stop implants through the thick-field isolation regions 23. The method of this invention includes use of more than two such implant energies with respectively smaller doses of impurity.

While this invention has been described with respect to illustrative embodiments, this description is not intended to be construed in a limiting sense. Upon reference to this description, various modifications of the illustrative embodiments, as well as other embodiments of the invention, will be apparent to persons skilled in the art. It is contemplated that the appended claims will cover any such modifications or embodiments that fall within the scope of the invention.

What is claimed is:

1. A method for electrically insulating at least one pair of source/drain diffusions of first conductivity-type formed in a first well of second conductivity-type opposite said first conductivity-type, said first well formed in a second well of said first conductivity-type, said method comprising:

forming a thick-field isolation region on said first well, said thick-field isolation region between said pair of source/drain diffusions;

selectively implanting at a first energy level a first dose of an impurity of said second conductivity-type through said thick-field isolation region into said first well;

selectively implanting at a second energy level a second dose of said impurity of said second conductivity-type through said thick-field isolation region into said first well.

2. The method of claim 1, wherein said first conductivity-type is N-type.

3. The method of claim 1, wherein said impurity is boron.

4. The method of claim 1, wherein said first energy level is in the approximate range of 120 KeV to 140 KeV.

5. The method of claim 1, wherein said second energy level is in the approximate range of 135 KeV to 155 KeV.

6. The method of claim 1, wherein said impurity is boron and wherein each of said first and said second dose of impurity are in the range of $1\times10^{12}$ to $6\times10^{12}/cm^2$.

7. The method of claim 1, wherein said pair of source/drain diffusions are part of a Flash EPROM.

8. The method of claim 1, wherein said thick-field isolation region thermally grown.

9. The method of claim 1, further including selectively implanting at a third energy level a third dose of said impurity of said second conductivity-type through said thick-field isolation region into said first well.

10. The method of claim 1, wherein said selectively implanting steps are performed after at least one etch of said thick-field isolation region.

11. A method for electrically insulating a pair of first conductivity-type diffusions formed in a second conductivity-type well, said second conductivity-type opposite said first conductivity-type, said second conductivity-type well formed in a first conductivity-type well, said method comprising:

forming a thick-field isolation region on said second conductivity-type well, said thick-field isolation region between said pair of first conductivity-type diffusions;

selectively implanting at a first energy level a first dose of an impurity of said second conductivity-type through said thick-field isolation region into said second conductivity-type well;

selectively implanting at a second energy level a second dose of said impurity of said second conductivity-type through said thick-field isolation region into said second conductivity-type well.

12. The method of claim 11, wherein said first conductivity-type is N-type.

13. The method of claim 11, wherein said impurity is boron.

14. The method of claim 11, wherein said first energy level is in the approximate range of 120 KeV to 140 KeV.

15. The method of claim 11, wherein said second energy level is in the approximate range of 135 KeV to 155 KeV.

16. The method of claim 11, wherein said impurity is boron and wherein each of said first and said second dose of impurity is in the range of $1\times10^{12}$ to $6\times10^{12}/cm^2$.

17. The method of claim 11, wherein said pair of pair of first conductivity-type diffusions are part of a Flash EPROM.

18. The method of claim 11, wherein said thick-field isolation region is thermally grown.

19. The method of claim 11, further including selectively implanting at a third energy level a third dose of said impurity of said second conductivity-type through said thick-field isolation region into said second conductivity-type well.

20. The method of claim 11, wherein said selectively implanting steps are performed after at least one etch of said thick-field isolation region.

* * * * *